United States Patent
Chi et al.

(10) Patent No.: US 9,887,073 B2
(45) Date of Patent: Feb. 6, 2018

(54) PHYSICAL VAPOR DEPOSITION SYSTEM AND PHYSICAL VAPOR DEPOSITING METHOD USING THE SAME (71) Applicant: TAIWAN SEMICONDUCTOR MANUFACTURING CO., LTD., Hsinchu (TW)

(72) Inventors: Chih-Chien Chi, Hsinchu (TW); Hung-Wen Su, Chupei (TW); Pei-Hsuan Lee, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 8 days.

(21) Appl. No.: 14/622,397

(22) Filed: Feb. 13, 2015

(65) Prior Publication Data
US 2016/0240357 A1 Aug. 18, 2016

(51) Int. Cl.
H01J 37/34 (2006.01)
C23C 14/35 (2006.01)
C23C 14/04 (2006.01)

(52) U.S. Cl.
CPC ........ H01J 37/3447 (2013.01); C23C 14/046 (2013.01); C23C 14/35 (2013.01); H01J 37/3402 (2013.01)

(58) Field of Classification Search
CPC .................................................. H01J 37/3447
USPC .................................................... 204/192.17
See application file for complete search history.

(56) References Cited

U.S. PATENT DOCUMENTS

| 5,223,108 A * | 6/1993 | Hurwitt ................. C23C 14/044 204/192.12 |
| 5,980,702 A * | 11/1999 | Parker ................... C23C 14/046 204/192.12 |
| 6,362,097 B1 | 3/2002 | Demaray et al. |
| 2001/0030125 A1* | 10/2001 | D'Couto ............ C23C 14/0063 204/192.17 |
| 2009/0134011 A1* | 5/2009 | Rohrmann .............. C23C 14/34 204/192.2 |
| 2009/0308732 A1 | 12/2009 | Cao et al. |
| 2009/0308739 A1* | 12/2009 | Riker ...................... H01J 37/34 204/298.11 |
| 2011/0020486 A1 | 1/2011 | Pei |

FOREIGN PATENT DOCUMENTS

| CN | 102301451 A | 12/2011 |
| CN | 101962754 B | 3/2013 |
| CN | 102066603 B | 4/2013 |
| JP | 6-10125 A | 1/1994 |
| JP | 6-295903 A | 1/1994 |
| TW | 585929 B | 5/2004 |

* cited by examiner

Primary Examiner — Timon Wanga
(74) Attorney, Agent, or Firm — Maschoff Brennan (57) ABSTRACT A physical vapor deposition system includes a chamber, a cover plate, a pedestal, and a collimator. The cover plate is disposed on the chamber for holding a target. The pedestal is disposed in the chamber for supporting a wafer. The collimator is mounted between the cover plate and the pedestal. The collimator includes a plurality of sidewall sheets together forming a plurality of passages. At least one of the passages has an entrance and an exit opposite to the entrance. The entrance faces the cover plate, and the exit faces the pedestal. A thickness of one of the sidewall sheets at the entrance is thinner than a thickness of the sidewall sheet at the exit.

20 Claims, 7 Drawing Sheets

Fig. 8

PHYSICAL VAPOR DEPOSITION SYSTEM AND PHYSICAL VAPOR DEPOSITING METHOD USING THE SAME

BACKGROUND

Physical vapor deposition (PVD) is commonly used within the semiconductor industry, as well as within solar, glass coating, and other industries. A PVD system is to deposit metal layers onto substrates such as semiconductor wafers that is positioned in a vacuum plasma chamber. A PVD process is used to deposit a target material such as titanium or titanium nitride onto the semiconductor wafer. In a typical PVD system, the target materials to be coated are disposed in a vacuum chamber containing an inert gas such as argon. The metal layers can be used as diffusion barriers, adhesion or seed layers, primary conductors, antireflection coatings, etch stops, etc.

Theoretically, the target should be very wide relative to the semiconductor wafers so that the target represents an infinite source plane to the particle-receiving face of the semiconductor wafers. Unfortunately, the target has a finite size that is usually the same order of magnitude as that of the semiconductor wafers. Expelled or sputtered target atoms tend to leave the target in all directions, then collide with each other and scatter, arriving at the semiconductor wafers from a variety of angles. As a result, the metal layer in the areas of the etchings in the semiconductor wafer is formed unevenly, leaving a relatively thick lateral layer on the sidewalls of the etchings and a thin layer at the bottom of the etchings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In order to increase the directionality of expelled or sputtered target atoms onto a semiconductor wafer, a collimator can be used. The collimator is a structure having a plurality of passages to allow the atoms to pass through. As the atoms travel toward the semiconductor wafer, the atoms which are not substantially perpendicular to the semiconductor wafer impact on the sidewalls of the collimator and adhere thereto. Thus, the collimator allows only the atoms which follow a substantially perpendicular path to the semiconductor wafer to pass through. The metal layer which then forms on the semiconductor wafer is, therefore, of a generally uniform thickness. However, as more and more atoms are adhered on the sidewalls of the collimator, the atoms can close off the passages and prevent the atoms from entering the passages. Eventually, the collimator has to be replaced. Therefore, to extend the lifetime of collimators, a PVD system and a PVD method using the same are provided in the following paragraphs.

Figure 1:
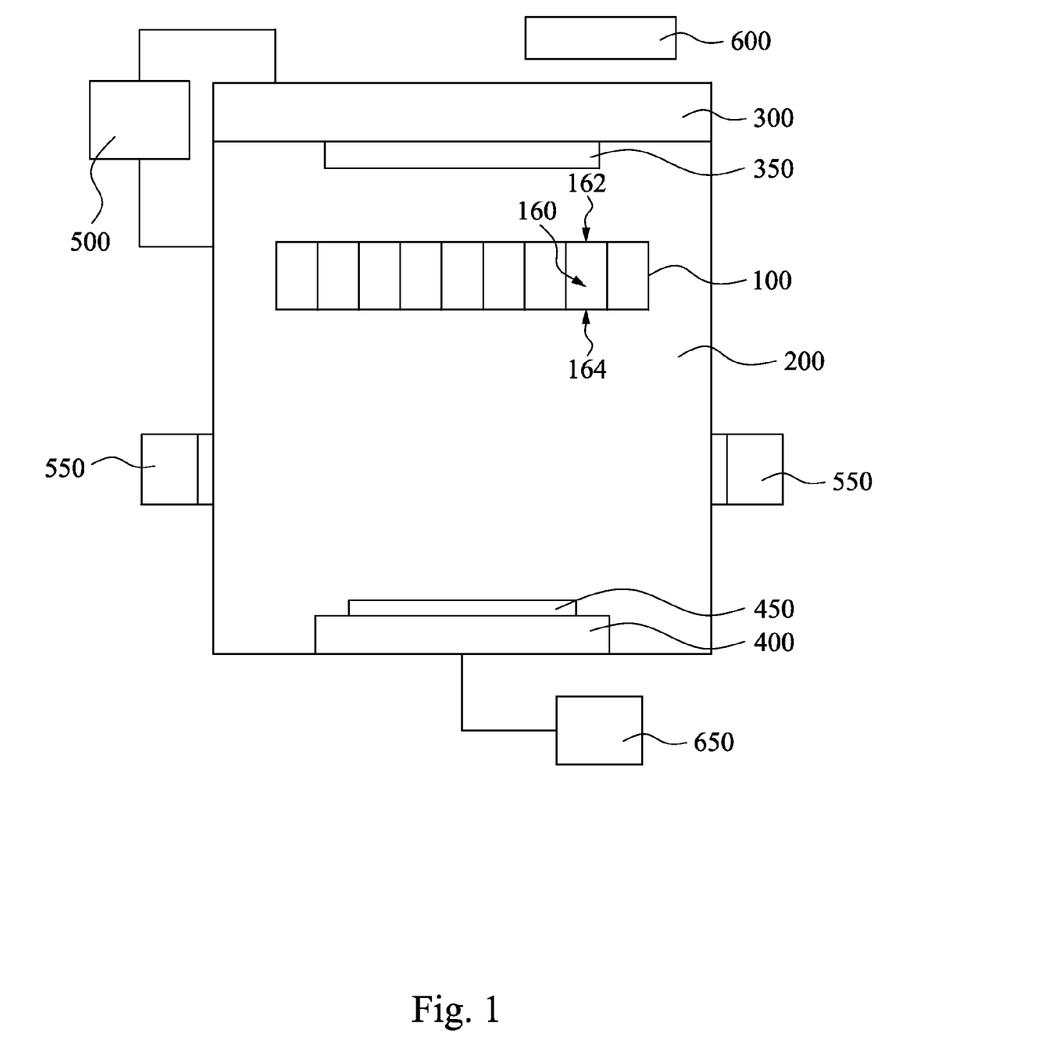
FIG. 1 is a schematic diagram of a physical vapor deposition (PVD) system in accordance with some embodiments.

FIG. 1 is a schematic diagram of a physical vapor deposition (PVD) system in accordance with some embodiments. The physical vapor deposition system includes a collimator 100, a chamber 200, a cover plate 300, and a pedestal 400. The cover plate 300 is disposed on the chamber 200 for holding a target 350. The pedestal 400 is disposed in the chamber 200 for supporting a wafer 450. The collimator 100 is mounted between the cover plate 300 and the pedestal 400. For example, the collimator 100 can be mounted on the walls of the chamber 200 through a plurality of fixing elements (such as screws).

Figure 2:
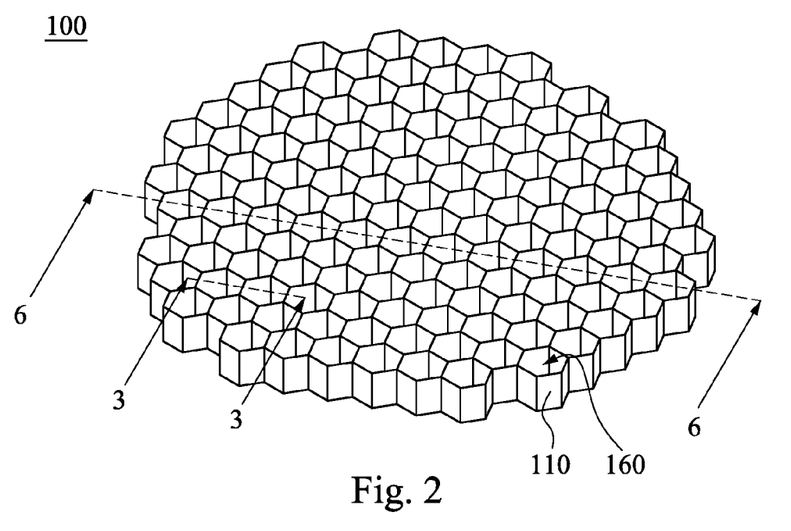
FIG. 2 is a schematic diagram of a collimator of FIG. 1 in accordance with some embodiments.
Figure 3:
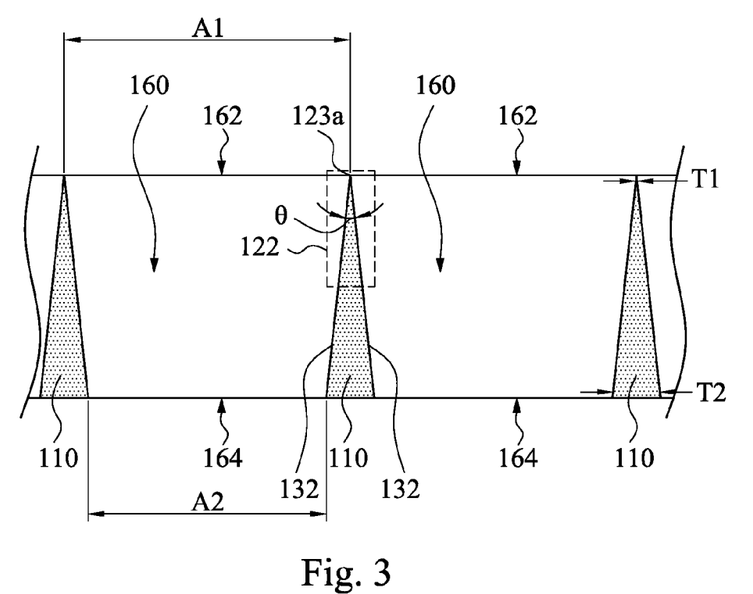
FIG. 3 is a cross-sectional view taken along line 3-3 of FIG. 2.

FIG. 2 is a schematic diagram of the collimator 100 of FIG. 1 in accordance with some embodiments, and FIG. 3 is a cross-sectional view taken along line 3-3 of FIG. 2. The collimator 100 includes a plurality of sidewall sheets 110 together forming a plurality of passages 160. At least one of the passages 160 has an entrance 162 and an exit 164 opposite to the entrance 162. A thickness T1 of at least one of the sidewall sheets 110 at the entrance 162 is thinner than a thickness T2 of the sidewall sheet 110 at the exit 164. In other words, a cross-sectional area A1 of at least one of the passages 160 at the entrance 162 is larger than a cross-sectional area A2 of the passage 160 at the exit 164. Reference is made to FIG. 1. The entrances 162 of the passages 160 face the cover plate 300 and the exits 164 of the passages 160 face the pedestal 400.

Reference is made to FIGS. 1-3. The function of the collimator 100 is to allow only atoms which follow paths that are relatively perpendicular to the wafer 450 to pass through and to intercept atoms that are not relatively perpendicular to the wafer 450. This ensures that an even layer of metallic material is formed on the wafer surfaces. The expelled or sputtered atoms enter the collimator 100 from the entrances 162 of the passages 160 and leave from the exits 164. During the physical vapor deposition operation, the atoms scattering at large angles may impinging upon the sidewall sheets 110 of the collimator 100. This lateral growth can result in overgrowth at the tops of the sidewall sheets 110. However, since the thickness T1 of one of the sidewall sheets 110 is thinner than the thickness T2, or the cross-sectional area A1 of one of the passage 160 is larger than the cross-sectional area A2, the atoms do not close off the passages 160 so soon, such that the lifetime of the collimator 100 can be extended, and the process maintain frequency can be reduced, which leaves more time for manufacturing.

In FIG. 3, at least one of the sidewall sheets 110 has a tapered edge 122 adjacent to the entrance 162. The term "tapered edge", as used herein, means that the main surfaces 132 of the sidewall sheet 110 each taper towards each other to form a sharp or pointed edge, or the main surfaces 132 are inclined towards a terminal (for example, a peak terminal 123a in FIG. 3) of the tapered edge 122. In other words, the passages 160 get narrower towards the exits 164. The main surfaces 132 herein are opposite to each other and respectively face two adjacent of the passages 160. The atoms are mainly adhered on these main surfaces 132.

In FIG. 3, the tapered edge 122 has a peak terminal 123a. Therefore, the cross-sectional view of the sidewall sheet 110 in FIG. 3 substantially forms a triangle. The peak terminal 123a has an angle θ ranging from about 1 degree to about 89 degrees. In some embodiments, the thickness T1 ranges from about 1 mm to about 2 cm.

Figure 4A:
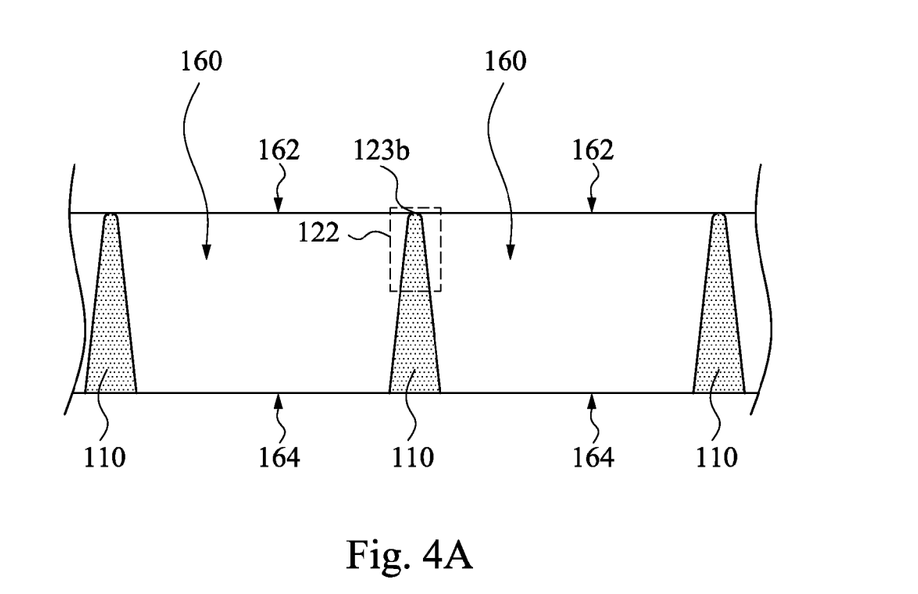
FIGS. 4A and 4B are cross-sectional views of the collimator of FIG. 2 according to some other embodiments.
Figure 4B:
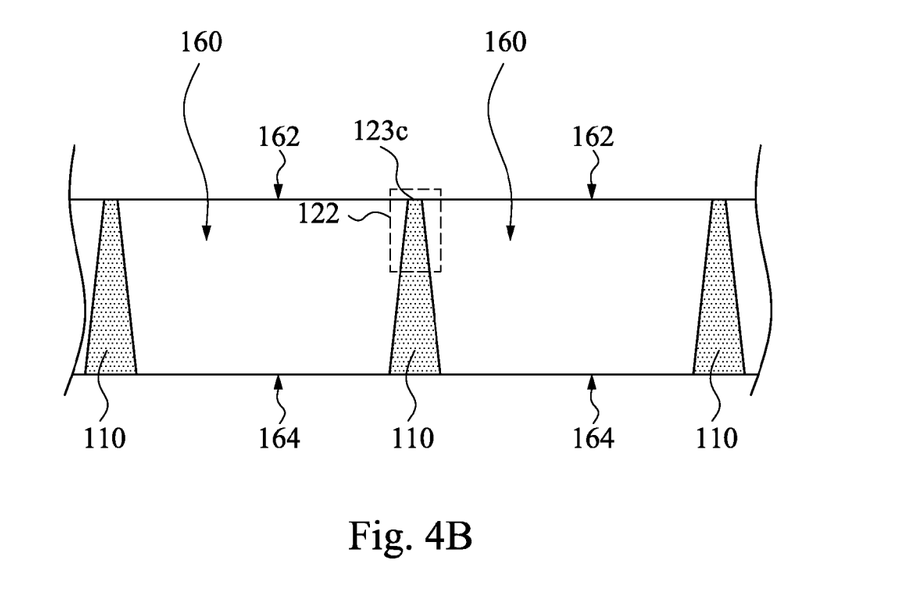

FIGS. 4A and 4B are cross-sectional views of the collimator 100 of FIG. 2 according to some other embodiments. In FIG. 4A, the tapered edge 122 has a round terminal 123b. For example, from the cross-sectional view, the terminal of the tapered edge 122 is round-shaped. In FIG. 4B, the tapered edge 122 has a flat terminal 123c. For example, from the cross-sectional view, the tapered edge 122 has a flat top. The shapes of the terminal of the tapered edge 122 mentioned above are illustrative, and should not limit the claimed scope of the present disclosure. Basically, embodiments fall within the claimed scope if the thickness T1 (see FIG. 3) is thinner than the thickness T2 (see FIG. 3). Other relevant structural details of the collimator 100 in FIGS. 4A and 4B are all similar to the collimator 100 in FIG. 3, and, therefore, a description in this regard will not be repeated hereinafter.

Figure 5A:
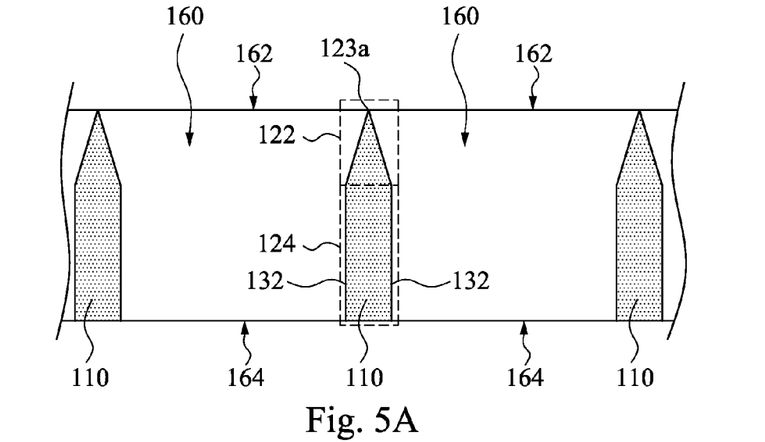
FIG. 5A is a cross-sectional view of the collimator of FIG. 2 according to still some other embodiments.

FIG. 5A is a cross-sectional view of the collimator 100 of FIG. 2 according to still some other embodiments. In FIG. 5A, at least one of the sidewall sheets 110 further has a flat edge 124 adjacent to the exit 164. In greater detail, the sidewall sheets 110 in FIG. 5A has the tapered edge 122 adjacent to the entrance 162 and the flat edge 124 adjacent to the exit 164. Portions of the two main surfaces 132 in the region of the tapered edge 122 are inclined towards a terminal (for example, a peak terminal 123a in FIG. 5A) of the tapered edge 122, and portions of the two main surfaces 132 in the region of the flat edge 124 are substantially parallel to each other. In some embodiments, the height of the tapered edge 122 is shorter than the flat edge 124, as shown in FIG. 5A. In some other embodiments, the tapered edge 122 and the flat edge 124 have substantially equal heights. In still some other embodiments, the height of the tapered edge 122 is longer than the flat edge 124. Other relevant structural details of the collimator 100 in FIG. 5A are all similar to the collimator 100 in FIG. 3, and, therefore, a description in this regard will not be repeated hereinafter.

Figure 5B:
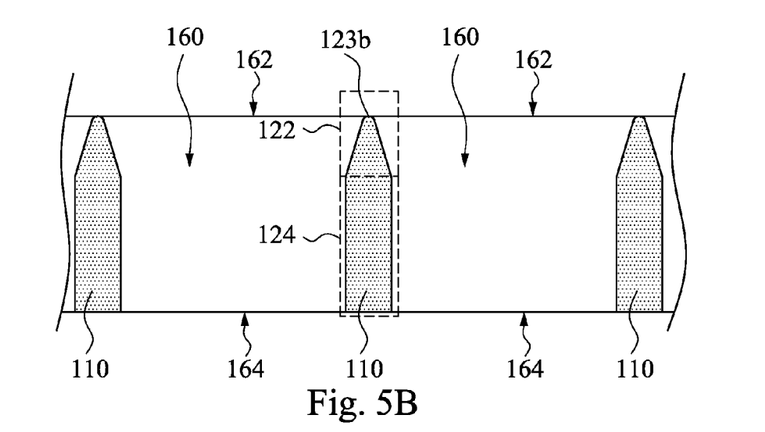
FIGS. 5B and 5C are cross-sectional views of the collimator of FIG. 2 according to still some other embodiments.
Figure 5C:
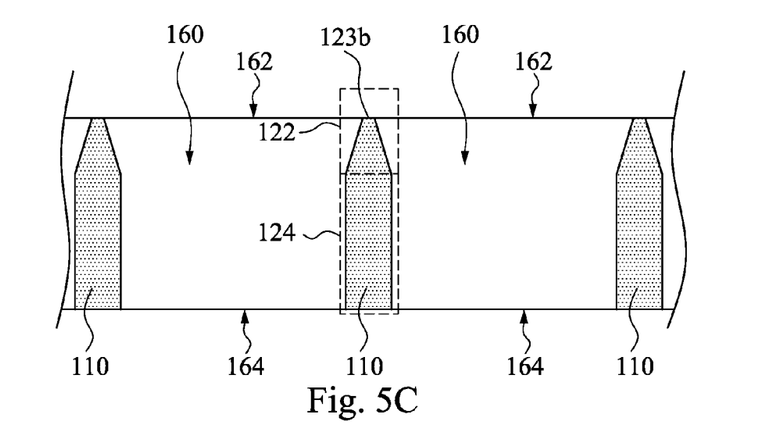

FIGS. 5B and 5C are cross-sectional views of the collimator 100 of FIG. 2 according to still some other embodiments. In FIG. 5B, the tapered edge 122 has a round terminal 123b. For example, from the cross-sectional view, the terminal of the tapered edge 122 is round-shaped. In FIG. 5C, the tapered edge 122 has a flat terminal 123c. For example, from the cross-sectional view, the tapered edge 122 has a flat top. In some embodiments, the height of the tapered edge 122 is shorter than the flat edge 124, as shown in FIGS. 5B and 5C. In some other embodiments, the tapered edge 122 and the flat edge 124 have substantially equal heights. In still some other embodiments, the height of the tapered edge 122 is longer than the flat edge 124. The shapes of the terminal of the tapered edge 122 mentioned above are illustrative, and should not limit the claimed scope of the present disclosure. Basically, embodiments fall within the claimed scope if the thickness T1 (see FIG. 3) of the sidewall sheets 110 at the entrance 162 is thinner than the thickness T2 (see FIG. 3) of the sidewall sheets 110 at the exit 164. Other relevant structural details of the collimator 100 in FIGS. 5B and 5C are all similar to the collimator 100 in FIG. 3, and, therefore, a description in this regard will not be repeated hereinafter.

Reference is made again to FIGS. 2 and 3. The sidewall sheets 110 may be integrated formed. Alternatively, the sidewall sheets 110 may be assembled together to form the collimator 100 in other embodiments. The sidewall sheets 110 can be made of braze, steel, aluminum, titanium, stainless steel, alloys, or other suitable materials. In some embodiments, the passages 160 have cross-sectional configurations of hexagons, as shown in FIG. 2. Therefore, the passages 160 together form a honeycomb appearance. For a hexagonal passage 160, the atoms entering the passage 160 have low probability to adhere to the corners of the passage 160. Hence, the lifetime of the collimator 100 can be extended. However, in some other embodiments, the passages 160 of other cross-sectional configurations may also be produced such as triangles, squares, rectangles, other nestable shapes, or combination thereof.

Figure 6:
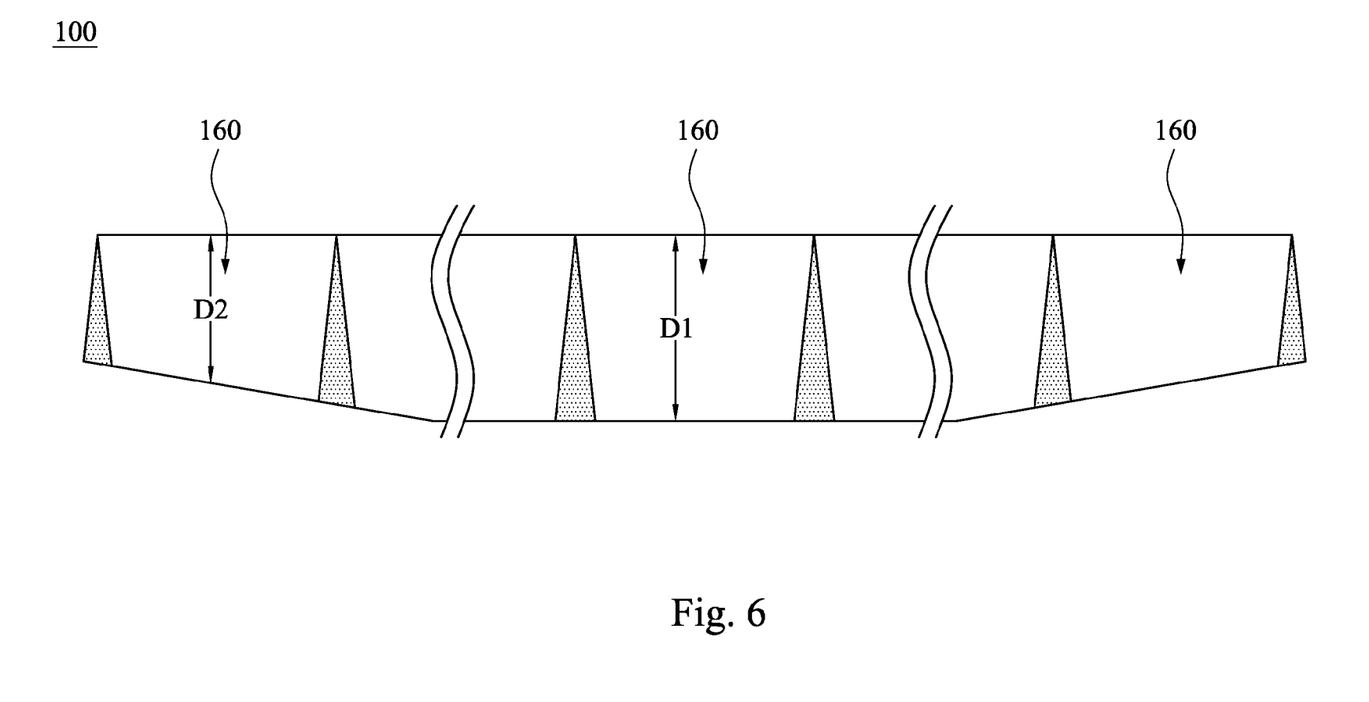
FIG. 6 is a cross-sectional view taken along line 6-6 of FIG. 2.

FIG. 6 is a cross-sectional view taken along line 6-6 of FIG. 2. In FIG. 6, a depth D1 of the passage 160 at a center region of the collimator 100 is deeper than a depth D2 of the passage 160 at a boundary region of the collimator 100. In greater detail, the expelled or sputtered atoms of the target 350 travel towards wide directions. Large amount of the atoms enters the center region of the collimator 100, and few atoms enter boundary region of the collimator 100. The amount of the atoms passing through the passages 160 depends on the depth of the passage 160. The depth D2 of the passage 160 is not deep than the depth D1, such that less atoms is filtered at the boundary region, resulting in a uniform spatial distribution of the filtered atoms.

Reference is made again to FIG. 1. In FIG. 1, the collimator 100 is disposed near the cover plate 300 and away from the pedestal 400. For example, the collimator 100 can be disposed in the upper half portion of the chamber 200. This configuration prevents the atoms filtered by the collimator 100 from forming a patterned layer on the wafer 450 due to the pattern (for example, honeycomb pattern in FIG. 2) of the collimator 100.

In some embodiment, the physical vapor deposition system further includes a direct current (DC) power supply 500 electrically connected to the cover plate 300. The direct current power supply 500 establishes a voltage potential between the chamber 200 and the target 350 mounted onto the cover plate 300. The negative terminal of the direct current power supply 500 can be connected to the cover plate 300 and the positive terminal is grounded to the chamber 200. A negative bias is applied to the cover plate 300 while holding the chamber 200 at ground potential. As a result, an electric field is generated in the chamber 200.

Plasma is generated in the physical vapor deposition system by introducing a plasma feed gas, such as argon, into the chamber 200. Electrons collide with atoms of the plasma feed gas to create ions. The negative bias applied by the direct current power supply 500 attracts the ions towards the target 350. The ions collide with the target 350 with high energy. In other words, the negative bias on the cover plate 300 accelerates positive ions of the formed plasma towards the target 350 to sputter atoms from the target 350. The sputtered atoms are dislodged from the surface of the target 350 by direct momentum transfer. The sputtered atoms may or may not become ionized, and a subset of them subsequently travels through the collimator 100 and onto the wafer 450. In some embodiments, the target 350 can be made of aluminum, tantalum, titanium, copper or other suitable target material.

In some embodiments, the physical vapor deposition system can further include a magnetic field generator 550 disposed around the chamber 200 in a region just above the pedestal 400 for generating magnetic fields in the chamber 200. The magnetic fields are used to increase a residence time of the electrons by causing the electrons to spiral through the plasma. By varying the shape of the magnetic fields of the magnetic field generator 550, the plasma can be directionally controlled. Therefore, ionization levels of the plasma feed gas also increase. In some embodiments, the magnetic field generator 550 may be coaxial electromagnetic coils (including solenoids), as well as appropriate arrangements of permanent magnets, and combinations of electromagnetic coils and permanent magnets, as will be understood by one of skill in the art. A DC and/or an radio frequency (RF) biases can be applied to the magnetic field generator 550 to generate the magnetic fields. Plasma uniformity, particularly uniformity of the plasma near the wafer 450, is controlled by the magnetic field generator 550 and supplied with RF or DC bias. Moreover, since the wafer 450 is usually a circular wafer, concentric electromagnetic coils may be used.

In some embodiments, in order to control the density and distribution of the coating metal layer, magnetic fields around the target 350 can be manipulated. Therefore, the physical vapor deposition system can further include a magnet 600 disposed above the cover plate 300. When the physical vapor deposition system is operating, the magnetic fields generated by the magnet 600 forces arc to occur at an intersection of the magnetic fields and the surface of the target 350, thereby influencing where a vaporized coating. The magnet 600 can be suspended upon the cover plate 350. Shifting the position of the magnet 600 provides for positioning of the arc for controlling vapor deposition. While the magnet 600 is described herein as a single magnet, it is understood that a magnet assembly, or some combination of permanent magnets and electromagnets, could also be used with minimal modification to the disclosure.

In some embodiments, the pedestal 400 can be an electrostatic chuck (ESC) for electrostatically holding the wafer 450 in place, and the claimed scope is not limited in this respect. Although electrostatic chucks vary in design, they are based on the principal of applying voltage to one or more electrodes in the chuck so as to induce opposite polarity charges in the wafer 450 and electrodes, respectively. The electrostatic attractive force between the opposite charges presses the wafer 450 against the chuck, thereby retaining the wafer 450. Moreover, an additional function of the pedestal 400 may include wafer temperature control during deposition and sputtering.

In some embodiments, the physical vapor deposition system can further include a RF bias supply 650 electrically connected to the pedestal 400. An RF frequency is applied by the RF bias supply 650 for coupling energy to kinetic electrons to excite the plasma ions near the wafer 450. Typically, the power frequency of the RF bias supply 650 is a very high frequency (VHF) because of the low mass-to-charge ratio of electrons. The ions of the VHF-coupled plasma formed near the wafer 450 are employed in the re-sputtering step. However, in other embodiments, the pedestal 400 may be grounded or left electrically floating.

Figure 7:
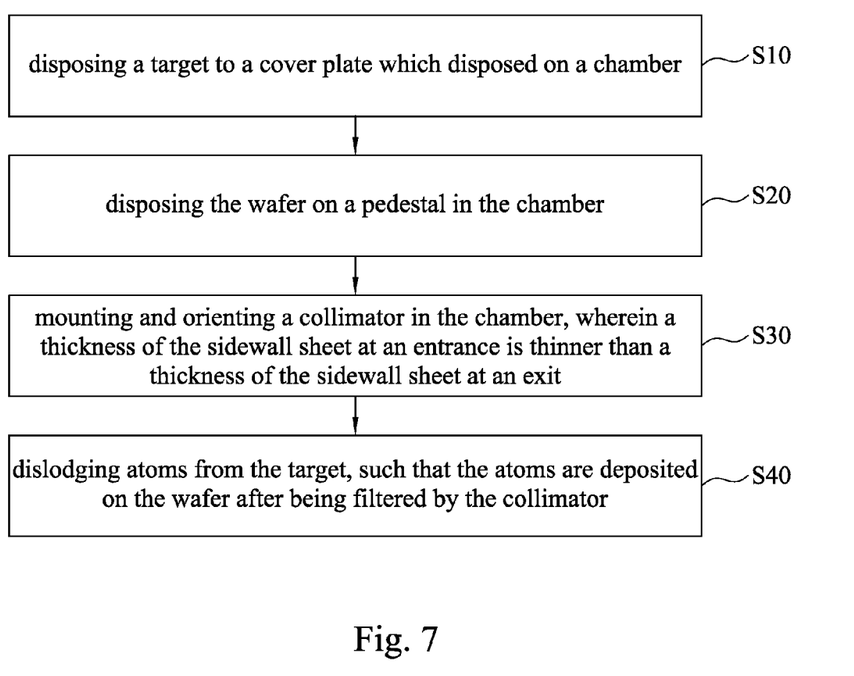
FIG. 7 is a flowchart of a method for physical vapor depositing a wafer in accordance with some embodiments.

FIG. 7 is a flowchart of a method for physical vapor depositing a wafer in accordance with some embodiments. To describe clarified, the method can be applied to, but should not be limited to, the physical vapor deposition system of FIG. 1. Reference is made both to FIGS. 1 and 7. As shown in operation S10, the target 350 is disposed to the cover plate 300 which disposed on the chamber 200 of the physical vapor deposition system. In some embodiments, the target 350 can be made of aluminum, tantalum, titanium, copper or other suitable target material.

As shown in operation S20, the wafer 450 is disposed on the pedestal 400 in the chamber 200. In some embodiments, the pedestal 400 can be an electrostatic chuck (ESC) for electrostatically holding the wafer 450 in place, and the claimed scope is not limited in this respect.

As shown in operation S30, the collimator 100 is mounted and oriented in the chamber 200. Reference is made to FIGS. 1 and 3. In greater detail, the collimator 100 can be mounted on the walls of the chamber 200 by a plurality of fixing elements such as screws. The collimator 100 is oriented such that the entrances 162 of the passages 160 thereof face the target 350 and the cover plate 300, and the exits 164 of the passages 160 thereof face the wafer 450 and the pedestal 400. The thickness T1 of one of the sidewall sheets 110 at the entrance 162 is thinner than the thickness T2 of the sidewall sheet 110 at the exit 164, or the cross-sectional area A1 of one of the passages 160 at the entrance 162 is larger than the cross-sectional area A2 of the passage 160 at the exit 164.

Reference is made again to FIGS. 1 and 7. As shown in operation S40, atoms are dislodged from the target 350, such that the atoms are deposited on the wafer 450 after being filtered by the collimator 100. The function of the collimator 100 is to allow only atoms which follow paths that are relatively perpendicular to the wafer 450 to pass through and to intercept atoms that are not relatively perpendicular to the wafer 450. Since the thickness T1 (see FIG. 3) of the sidewall sheets 110 at the entrances 162 is thinner than the thickness T2 (see FIG. 3) of the sidewall sheets 110 at the exits 164, the atoms do not close off the passages 160 so soon, such that the lifetime of the collimator 100 can be extended, and the process maintain frequency can be reduced, which leaves more time for manufacturing.

Figure 8:
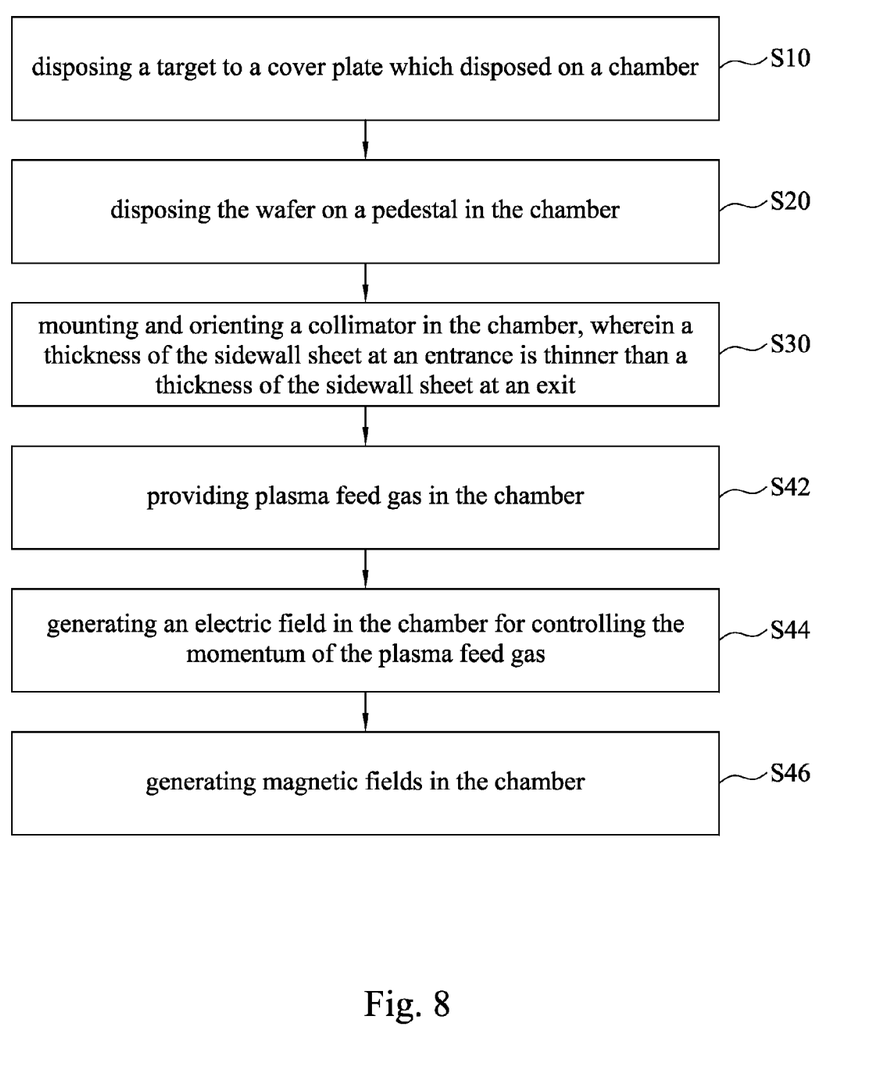
FIG. 8 is a flowchart of a method for physical vapor depositing a wafer in accordance with some embodiments.

FIG. 8 is a flowchart of a method for physical vapor depositing a wafer in accordance with some embodiments. Reference is made to FIGS. 1 and 8. Since the operation details are similar to FIG. 7, and, therefore, a description in this regard will not be repeated hereinafter. In some embodiments, to dislodge atoms from the target 350, plasma feed gas, such as argon, can be provided in the chamber 200, as shown in operation S42. Subsequently, an electric field is generated in the chamber 200 for controlling the momentum of the plasma feed gas, as shown in operation S44. For example, the DC power supply 500 in FIG. 1 can be electrically connected to the cover plate 300 to provide the electric field across the plasma feed gas in the chamber 200. Therefore, electrons collide with atoms of the plasma feed gas to create ions. The negative bias applied by the direct current power supply 500 attracts the ions towards the target 350 to sputter atoms from the target 350.

In some embodiments, as shown in operation S46, a magnetic field is generated in the chamber 200. For example, the magnetic field generator 550 can be disposed around the chamber 200 for generating magnetic fields in the chamber 200. The magnetic fields are used to increase a residence time of the electrons by causing the electrons to spiral through the plasma. Hence, ionization levels of the plasma feed gas also increase.

In some embodiments, the magnetic field distribution in the chamber 200 can be controlled. For example, the magnet 600 of FIG. 1 can be disposed above the cover plate 300. Shifting the position of the magnet 600, the magnetic field distribution is changed, thereby controlling vapor deposition.

In some embodiments, the portion of the plasma near the wafer 450 can be manipulated. For example, the RF bias supply 650 can be electrically connected to the pedestal 400 for coupling energy to kinetic electrons to excite the plasma ions near the wafer 450.

The function of the collimator is to allow only atoms which follow paths that are relatively perpendicular to the wafer to pass through and to intercept atoms that are not relatively perpendicular to the wafer. This ensures that an even layer of metallic material is formed on the wafer surfaces. The expelled or sputtered target atoms enter the collimator from the entrances of the passages and leave from the exits. During the physical vapor deposition operation, the atoms scattering at large angles may impinging upon the sidewall sheets of the collimator. This lateral growth can result in overgrowth at the tops of the sidewall sheets. However, since the thickness of one of the sidewall sheets at the entrance is thinner than the thickness of the sidewall sheet at the exit, or the cross-sectional area of one of the passages is larger than the cross-sectional area of the passage at the exit, the atoms do not close off the passages so soon, such that the lifetime of the collimator can be extended, and the process maintain frequency can be reduced, which leaves more time for manufacturing.

An aspect of the present disclosure is to provide a physical vapor deposition system including a chamber, a cover plate, a pedestal, and a collimator. The cover plate is disposed on the chamber for holding a target. The pedestal is disposed in the chamber for supporting a wafer. The collimator is mounted between the cover plate and the pedestal. The collimator includes a plurality of sidewall sheets together forming a plurality of passages. At least one of the passages has an entrance and an exit opposite to the entrance. The entrance faces the cover plate, and the exit faces the pedestal. A thickness of one of the sidewall sheets at the entrance is thinner than a thickness of the sidewall sheet at the exit.

Another aspect of the present disclosure is to provide a physical vapor deposition system including a chamber, a cover plate, a pedestal, and a collimator. The cover plate is disposed on the chamber for holding a target. The pedestal is disposed in the chamber for supporting a wafer. The collimator is mounted between the cover plate and the pedestal. The collimator includes a plurality of sidewall sheets together forming a plurality of passages. At least one of the passages has an entrance facing the cover plate and an exit facing the pedestal. A cross-sectional area of one of the passages at the entrance is smaller than a cross-sectional area of the passage at the exit.

Still another aspect of the present disclosure is to provide a method for physical vapor depositing a wafer including disposing a target to a cover plate. The cover plate is disposed on a chamber. The wafer is disposed on a pedestal in the chamber. A collimator is mounted and oriented in the chamber. The collimator includes a plurality of sidewall sheets together forming a plurality of passages. At least one of the passages has an entrance facing the cover plate and an exit facing the pedestal. A thickness of one of the sidewall sheets at the entrance is thinner than a thickness of the sidewall sheet at the exit. Atoms are dislodged from the target, such that the atoms are deposited on the wafer after being filtered by the collimator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A physical vapor deposition system, comprising:
   a chamber;
   a cover plate disposed on the chamber for holding a target;
   a pedestal disposed in the chamber for supporting a wafer; and
   a collimator disposed between the cover plate and the pedestal, wherein the collimator comprises:
      a plurality of sidewall sheets together forming a plurality of passages, wherein at least one of the passages has an entrance and an exit opposite to the entrance, the entrance faces the cover plate, the exit faces the pedestal, a thickness of one of the sidewall sheets at the entrance is thinner than a thickness of the sidewall sheet at the exit, at least one of the sidewall sheets comprises a tapered portion and a flat portion extending from the tapered portion towards the exit and the tapered portion has a height greater than a height of the flat portion.

2. The physical vapor deposition system of claim 1, wherein the tapered portion has a pointed top.

3. The physical vapor deposition system of claim 1, wherein the tapered portion has a rounded top.

4. The physical vapor deposition system of claim 1, wherein the tapered portion has a flat top.

5. The physical vapor deposition system of claim 1, wherein at least one of the sidewall sheets further has two main surfaces, portions of the two main surfaces in a region of the tapered portion are inclined towards a terminal of the tapered portion, and portions of the two main surfaces in a region of the flat portion are substantially parallel to each other.

6. The physical vapor deposition system of claim 1, wherein at least one of the passages gets narrower towards the exit.

7. The physical vapor deposition system of claim 1, wherein the passages have cross-sectional configurations of hexagons, triangles, squares, rectangles, or combinations thereof.

8. The physical vapor deposition system of claim 1, wherein a depth of one of the passages at a center region of the collimator is deeper than a depth of another of the passages at a boundary region of the collimator.

9. A physical vapor deposition system, comprising:
a chamber;
a cover plate disposed on the chamber for holding a target;
a pedestal disposed in the chamber for supporting a wafer; and
a collimator disposed between the cover plate and the pedestal, wherein the collimator comprises:
a plurality of sidewall sheets together forming a plurality of passages, wherein at least one of the passages has an entrance facing the cover plate and an exit facing the pedestal, a cross-sectional area of one of the passages at the entrance is larger than a cross-sectional area of the passage at the exit, and the entire of at least one of the sidewall sheets has a triangular cross section.

10. The physical vapor deposition system of claim 9, wherein the cover plate is closer to the collimator than the pedestal.

11. The physical vapor deposition system of claim 9, further comprising:
a direct current power supply electrically connected to the cover plate.

12. The physical vapor deposition system of claim 9, further comprising:
a magnetic field generator disposed around the chamber for generating magnetic fields in the chamber.

13. The physical vapor deposition system of claim 11, further comprising:
a magnet disposed above the cover plate for controlling a magnetic field distribution in the chamber.

14. The physical vapor deposition system of claim 9, further comprising:
an RF bias supply electrically connected to the pedestal.

15. The physical vapor deposition system of claim 9, wherein said at least one of the passages has a cross-sectional configuration of a hexagon, a triangle, a square, or a rectangle.

16. The physical vapor deposition system of claim 9, wherein a depth of one of the passages at a center region of the collimator is deeper than a depth of another of the passages at a boundary region of the collimator.

17. The physical vapor deposition system of claim 9, wherein at least one of the passages gets wider towards the entrance.

18. A physical vapor deposition system, comprising:
a chamber;
a cover plate disposed on the chamber;
a pedestal disposed in the chamber for supporting a wafer; and
a collimator disposed in the chamber and between the cover plate and the pedestal, wherein the collimator comprises:
a plurality of sidewall sheets together forming a plurality of passages, wherein at least one of the passages has an entrance facing the cover plate and an exit facing the pedestal, the at least one of the passages gets wider towards the entrance, and at least one of the sidewall sheets has triangular and rectangular cross sections that have substantially equal heights.

19. The physical vapor deposition system of claim 18, wherein the cover plate is closer to the collimator than the pedestal.

20. The physical vapor deposition system of claim 1, wherein the height of the tapered portion is greater than a thickness of the flat portion.

* * * * *